United States Patent [19]

Ng et al.

[11] Patent Number: 4,739,473
[45] Date of Patent: Apr. 19, 1988

[54] COMPUTER MEMORY APPARATUS

[75] Inventors: Alvan W. Ng, Lowell; Edwin P. Fisher, Abington, both of Mass.

[73] Assignee: Honeywell Information Systems Inc., Waltham, Mass.

[21] Appl. No.: 793,047

[22] Filed: Oct. 30, 1985

Related U.S. Application Data

[63] Continuation-in-part of Ser. No. 751,179, Jul. 2, 1985.

[51] Int. Cl.⁴ .................................................. G06F 12/00
[52] U.S. Cl. ....................................................... 364/200
[58] Field of Search ... 364/200 MS File, 900 MS File

[56] References Cited

U.S. PATENT DOCUMENTS

| | | | |
|---|---|---|---|
| 4,174,537 | 11/1979 | Chu et al. | 364/200 |
| 4,323,965 | 4/1982 | Johnson et al. | 364/200 |
| 4,563,736 | 1/1986 | Boudreau et al. | 364/200 |
| 4,628,489 | 12/1986 | Ong et al. | 365/230 |

*Primary Examiner*—Raulfe B. Zache
*Attorney, Agent, or Firm*—Faith F. Driscoll; John S. Solakian

[57] ABSTRACT

A memory subsystem couples to a bus in common with a central processing unit and processes memory requests received therefrom. The subsystem includes a number of addressable memory module units or stacks each having a number of word blocks of dynamic random access memory (DRAM) chips arranged in one of two subsystem configurations and mounted on a single circuit board which connects to the remainder of the subsystem through a single word wide interface. The configurations correspond to a common stack arrangement which provides double the normal amount of density and an adjacent stack arrangement of normal density. As a function of an input density signal, chip select circuits preselect a pair of blocks of RAM chips from a common stack or pair of adjacent stacks. Timing circuits generate a plurality of sequential column address pulses which are selectively applied to the preselected blocks of chips within an interval defined by a row address pulse. This results in the read out of a pair of words from the preselected blocks of a single stack or adjacent stacks in tandem into a pair of subsystem data registers. For each memory read request, the words from each preselected pair of blocks are read out into the data registers in the same sequence providing a double fetch capability without any loss in system performance.

20 Claims, 7 Drawing Sheets

COMPUTER MEMORY APPARATUS

This is a continuation-in part of co-pending patent application Ser. No. 751,179, filed on July 2, 1985.

BACKGROUND OF THE INVENTION

1. Field of Use

This invention relates to memory systems containing semiconductor memory elements including those in which stored information must be periodically refreshed to preserve the integrity of such information.

2. Prior Art

It is well known to construct memory systems from a number of memory modules. In certain prior art systems, memory modules are paired together to provide a double word fetch access capability. The term double word fetch access as used herein refers to the capability of being able to access a pair of words at a time from a memory system during a cycle of operation. This type of system is descibed in U.S. Pat. No. 4,236,203, assigned to the same assignee as named herein.

In the above prior art system, the memory system connects to an asynchronously operated single word wide system bus. In the arrangement, a request for multiple words is made in a single bus cycle and the requested information words are delivered to the bus over a cycle of operation which consists of a series of response cycles.

It will be noted that in such double word fetch memory module systems, it is necessary to generate and decode even and odd addresses for accessing both memory modules. Such an arrangement for accomplishing the required address generation/decoding is described in U.S. Pat. No. 4,185,323 which is assigned to the same assignee as named herein.

In the above arrangement, the low order bits of the address provided with the memory request specify the storage location being accessed while the high order bits specify which pair of rolls of DRAM chips is being selected.

The address arrangement includes a primary address register which also served as a counter and two parallel secondary address registers. In carrying out a double fetch operation, the initial address was loaded into the primary address register and then stored in the appropriate secondary address register. Then the memory subsystem, after signalling it was busy, incremented the initial address contents of the primary address register by one and the resulting address was then stored in the other secondary address register. Because of the additional time required to generate the second address, the memory timing circuits included circuits for generating two sets of clocking signals and for steering the sets of clocking signals to the appropriate memory module units. This was necessary to enable the read out of the pair of words into the subsystem data output registers in time for transfer to the bus.

To reduce this additional time, another arrangement employed sequential chip select decode apparatus which would provide a pair of decodes according to the least significant address bits for simultaneously accessing a pair of words from even and odd memories. A system which utilizes this arrangement is disclosed in U.S. Pat. No. 4,323,965 which is also assigned to the same assignee as named herein. While the system provided a double fetch capability with less circuits than the prior art, it still required circuits for accessing at least a pair of memories.

Moreover, as the capacities of these memories become more dense, it becomes desirable to provide the double patch memory in smaller increments. However, this is not possible in those prior art systems which provide a double fetch capability. Another consideration is that it becomes particularly desirable to provide the same functionality in both the earlier and later memory system designs. This is sometimes referred to as backward compatibility which results in reductions in manufacturing, inventory and maintenance costs.

Accordingly, it is a primary object of the present invention to provide a low cost memory subsystem which incorporates a double fetch capability.

It is a further object of the present invention to provide a double fetch memory subsystem which can be implemented with a minimum of circuits and is compatible with old and new designs.

SUMMARY OF THE INVENTION

The above and other objects are achieved in a preferred embodiment of the memory subsystem of the present invention which couples to a bus in common with a central processing unit and processes memory requests received therefrom. The subsystem includes a number of addressable memory module units or stacks which operatively couple to the bus. The stacks are organized into one of two subsystem configurations. The configurations include a common stack arrangement which provides double the normal amount of density and an adjacent stack arrangement which provides the normal amount of density. Each stack includes a number of word blocks of dynamic random access memory (DRAM) chips mounted on a single circuit board which connect to a pair of subsystem data registers through a single word wide interface. The subsystem utilizes chip select decode apparatus which preselects two blocks of RAM chips from the common stack or a pair of adjacent stacks as a function of an input density signal.

According to the present invention, timing circuits provide a plurality of sequential column address timing signals within an interval defined by a row address timing signal also generated by the timing circuits. Additionally, selection circuits are connected to apply each of the column timing signals to a different set of preselected word blocks of RAM chips of a common stack or adjacent stacks for reading out in tandem a plurality of words from the common stack or the adjacent stacks into the corresponding number of data registers. Each of the data registers is connected to be conditioned by a different predetermined one of column address timing signals to store a different one of the plurality of words in the same sequence for each memory read request. That is, the first word accessed is always stored in a first one of the registers, the second word in a second one of the registers. Accordingly, there is no need to include additional logic circuits for selecting which data register is to receive the first word or second word. Thereafter, under the control of the timing circuits, the data registers are conditioned to transfer the plurality of words to a central processing unit over a corresponding number of successive bus cycles of operation.

The result is that the subsystem of the present invention can be constructed at low cost and with a minimum of circuit complexity without any loss of system performance. That is, only a single word wide interface is required to provide the required memory capacity allowing for memory expansion. This facilitates maintenance and increases system reliability. Also, the subsystem can be easily configured to be compatible with older designs which provide the same functionality.

The novel features which are believed to be characteristic of the invention both as to its organization and method of operation, together with further objects and advantages will be better understood from the following description when considered in connection with the accompanying drawings. It is to be expressly understood, however, that each of the drawings are given for the purpose of illustration and description only and are not intended as a definition of the limits of the present invention.

DESCRIPTION OF THE PREFERRED EMBODIMENT

Figure 1:
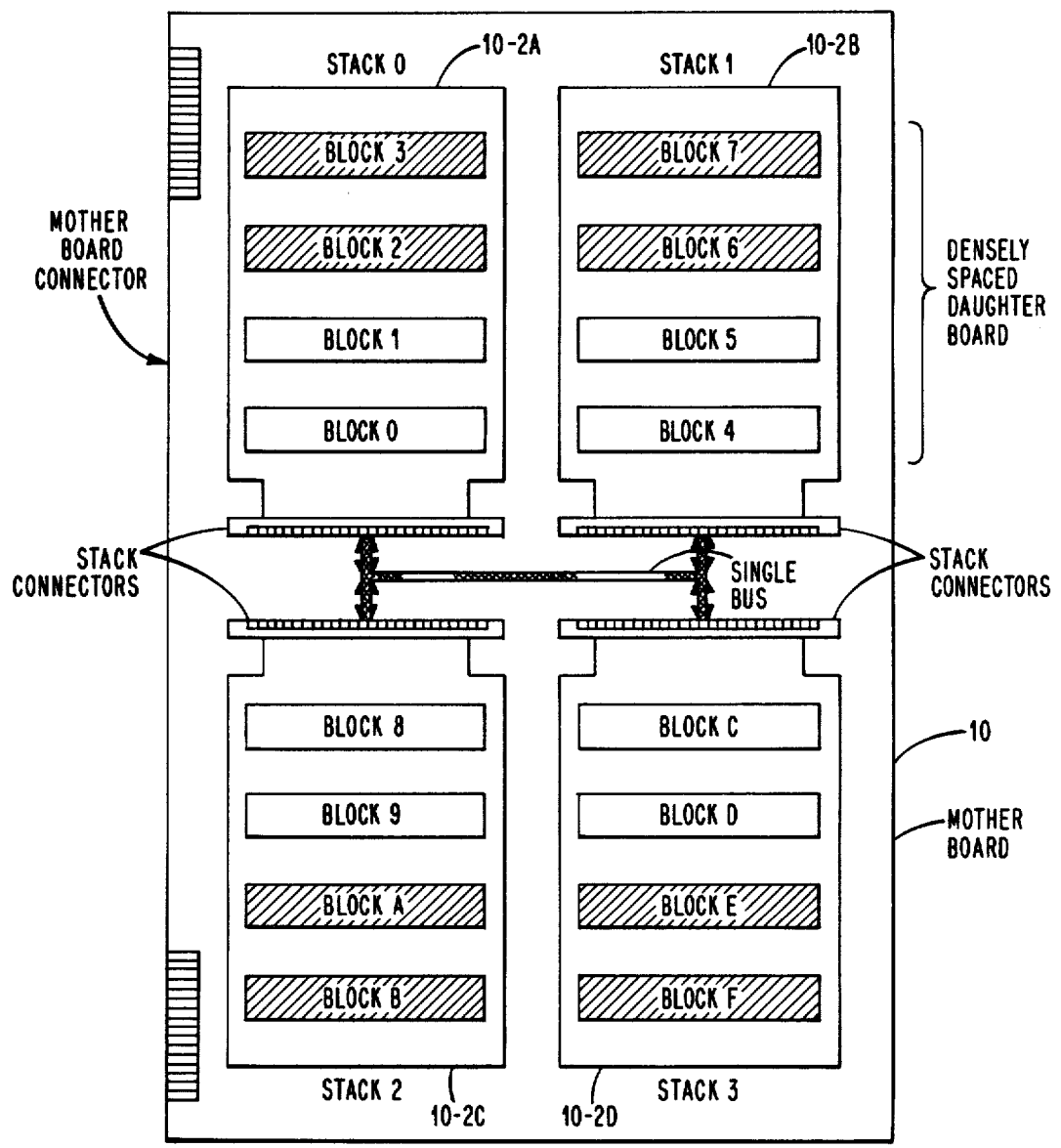
FIG. 1 shows in diagrammatic form a memory subsystem which incorporates the principles of the present invention.

FIG. 1 shows the organization of a memory subsystem 10 according to the present invention. As seen, the subsystem 10 includes a mother board which contains the memory control and bus interface circuits. The bottom part of the board includes a number of connectors which plug into a bus network over which requests and data are transmitted and received. The mother board can contain up to four memory stacks 10-A through 10-D mounted on small daughter boards which directly plug into the mother board via a number of stack connectors as shown. All of the daughter boards connect in common to a single bus, also as shown.

According to the teachings of the present invention, all stack connectors connect in common to a single bus. As explained herein, this arrangement allows the memory subsystem 10 to be organized into one of two configurations. The first configuration is a common stack arrangement which provides double the normal density corresponding to stacks containing four blocks of memory. The second configuration is an adjacent stack arrangement which provides the normal density corresponding to stacks containing two blocks of memory. The particular configuration is defined by the state of an input density signal received from a pin common to the daughter board connectors. The input density signal is applied via the single bus to circuits within the mother board as explained herein.

Figure 2:
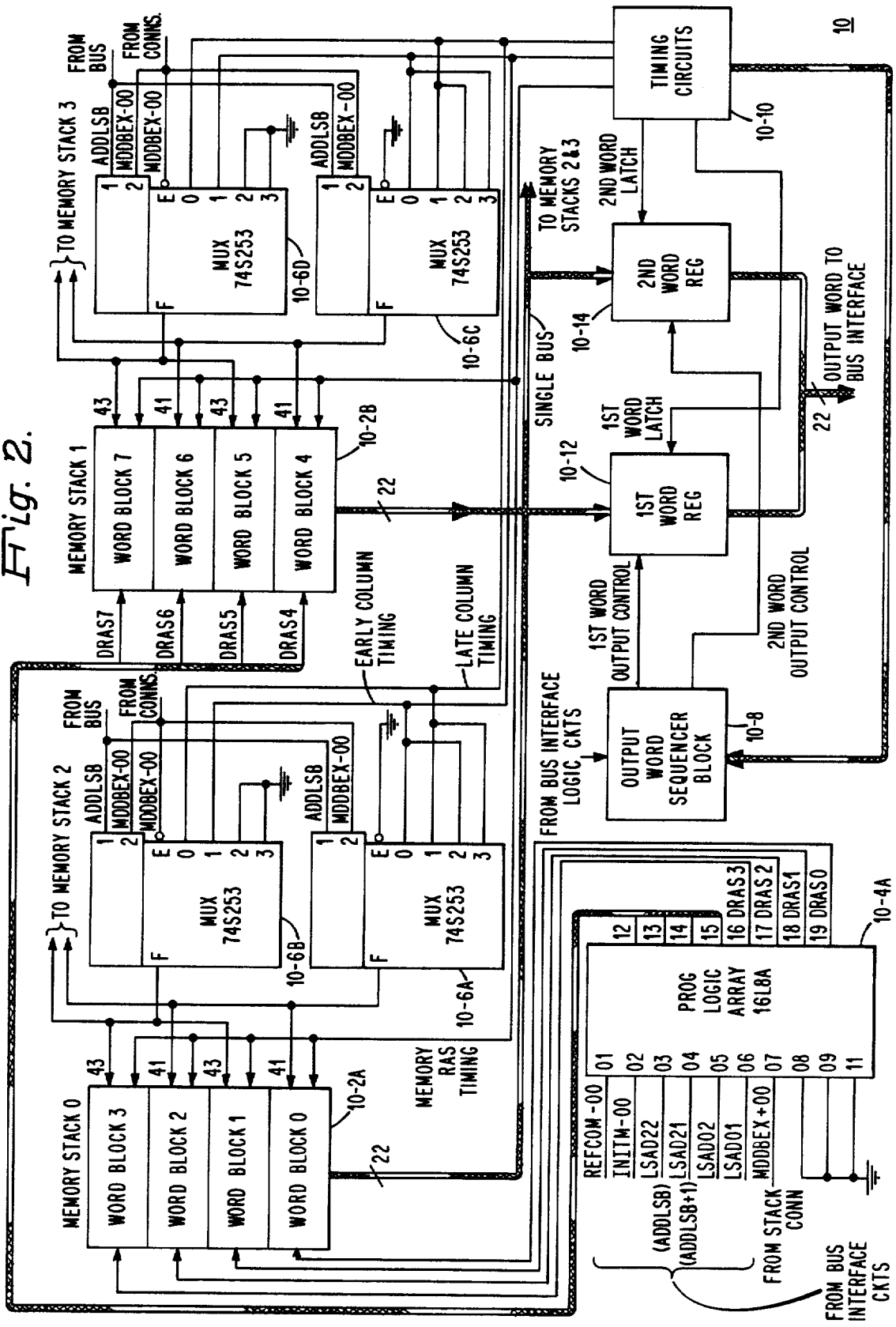
FIGS. 2 and 3, respectively, show in greater detail the memory subsystem of FIG. 1 in first and second configurations.

FIG. 2 shows in block diagram form, a first configuration of memory subsystem 10 constructed according to the principles of the present invention. The configuration is a common stack arrangement in which the subsystem 10 can have up to four memory stacks, all of which connect in common to a single bus. Each stack has double the normal density (i.e., four blocks). As seen from FIG. 2, the subsystem 10 includes memory module units or stacks 10-2A and 10-2B, a programmable logic circuit of block 10-4A, a column timing select circuit 10-6, an output word sequencer 10-8, the timing circuits of block 10-10 and a pair of data registers 10-12 and 10-14. Each of the memory stacks 10-2A and 10-2B includes four word blocks of 256K dynamic MOS RAM chips mounted on the single printed circuit daughter board. Each word is 22 bits.

The programmable logic array (PLA) circuit of block 10-4A in response to a double density signal MDDBEX+00, least significant bit address signals ADDLSB and ADDLSB+1 and most significant bit address signals LSAD01 and LSAD02 of the memory address of each memory request enable the selection of a pair of words from two of the memory blocks. The circuits include a programmable logic array constructed from standard integrated circuit chips such as the 16L8A manufactured by Advanced Micro Devices, Inc. The PLA circuit 10-4A generates a different one of the eight row address strobe signals DRAS0 through DRAS7 which are applied to the 256K DRAM chips of a corresponding one of the word blocks of stacks 10-2A and 10-2B. Within each of the stacks of each of the signals DRAS0 through DRAS3 and DRAS4 through DRAS7 are logically ANDed with a memory row address timing signal MEMRAS from timing circuits 10-10 and applied to the row address strobe (RAS) input terminals of the 256K DRAM chips.

The PLA circuit 10-4A generates the row address strobe signals DRAS0 through DRAS7 as outputs on pins 12 through 19 in accordance with the following Boolean equations:

$$
\begin{aligned}
19 &= /1 + /2 + /3^*/4^*/5^*/6; \\
18 &= /1 + /2 + /3^*/4^*/5^*/6^*7 \\
    &\quad + 3^*/4^*/5^*/6 \\
    &\quad + /3^*4^*/5^*/6^*/7; \\
17 &= /1 + /2 + 3^*/4^*/5^*/6^*7 \\
    &\quad + /3^*4^*/5^*/6^*7; \\
16 &= /1 + /2 + 4^*/5^*/6^*7; \\
15 &= /1 + /2 + /4^*/5^*/6^*/7 \\
    &\quad + /3^*/4^*5^*/6^*7; \\
14 &= /1 + /2 + 4^*/5^*/6^*/7 \\
    &\quad + /4^*5^*/6^*7; \\
13 &= /1 + /2 + 3^*/4^*5^*/6^*7 \\
    &\quad + /3^*4^*5^*/6^*7; \text{ and,} \\
12 &= /1 + /2 + 4^*5^*/6^*7.
\end{aligned}
$$

In the above equations, the symbols +, * and / have the following meanings:

+ = OR function;
* = AND function; and,
/ = the designated signal is low or a binary ZERO.

Another PLA circuit 10-4B, not shown, generates a similar set of row address strobe signals in response to the same input signals as outputs on pins 12 through 19 in accordance with the following Boolean equations:

$$
\begin{aligned}
19 &= /1 + /2 + /3^*/4^*5^*/6^*/7 + /3^*/4^*/5^*6^*7; \\
18 &= /1 + /2 + 3^*/4^*5^*/6^*/7 + /3^*4^*5^*/6^*/7 \\
    &\quad + /4^*/5^*6^*7; \\
17 &= /1 + /2 + 3^*/4^*/5^*6^*7 + /3^*4^*/5^*6^*7; \\
16 &= /1 + /2 + 4^*/5^*6^*7; \\
15 &= /1 + /2 + /4^*5^*/6^*/7 + /3^*/4^*5^*6^*7; \\
14 &= /1 + /2 + 4^*5^*/6^*/7 + /4^*5^*6^*7; \\
13 &= /1 + /2 + 3^*/4^*5^*6^*7 + /3^*4^*5^*6^*7; \text{ and,} \\
12 &= /1 + /2 + 4^*5^*6^*7.
\end{aligned}
$$

Additionally, each of the memory stacks 10-2A and 10-2B receives early column timing and late column timing signals from pairs of selector circuits 10-6A, 10-6B and 10-6C, 10-6D in response to least significant address bit signal ADDLSB and double density signal MDDEBEX-00. When double density signal MDDBEX-00 is a binary ZERO, the selector circuits 10-6A through 10-6D switch between input positions 0 and 1 ignoring positions 2 and 3. The least significant bit address signal ADDLSB determines which block is to receive the early and late column pulses. That is, when ADDLSB is a binry ZERO, the "0" inputs (early and late column pulses) are selected to be applied as outputs for selector circuits 10-6A and 10-6C and circuits 10-6B and 10-6D respectively. When signal ADDLSB is a binary ONE, the "1" inputs (late and early column pulses) are selected as outputs for circuits 10-6A and 10-6C and circuits 10-6B and 10-6D respectively. The early column and late column timing signals are applied to the column address strobe (CAS) input terminals of the 256K DRAM chips. It will be noted that one selector output is applied to the chips of blocks 0 and 2 while the other output is applied to the chips of blocks 1 and 3. The circuits 10-6A through 10-6D are constructed from selector circuits such as those designated as 74S253 manufactured by Texas Instruments Incorporated.

The memory words read out from stacks 10-2A and 10-2B are stored in the first word and second word registers 10-12 and 10-14 in response to latch timing signals from the circuits 10-10. The circuits of the output word sequencer 10-8 controls the transfer of the contents of the registers 10-12 and 10-14 in response to timing signals from circuits 10-10 and from bus interface logic circuits, not shown.

Figure 3:
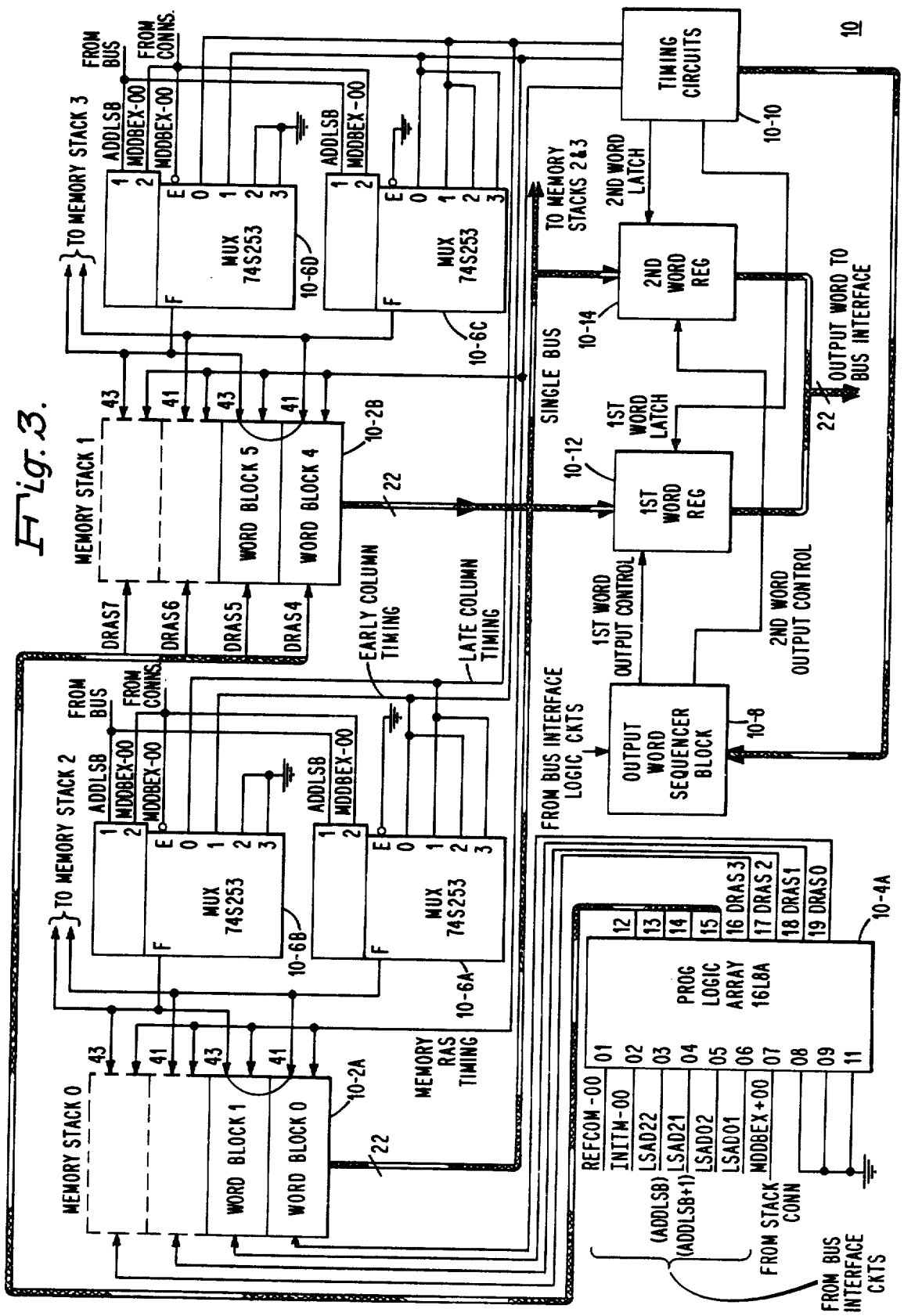

FIG. 3 shows in block diagram form, a second configuration of memory subsystem 10. The configuration is an adjacent stack arrangement in which subsystem 10 has at least a pair of memory stacks and up to a maximum of two pairs of memory stacks, all of which connect in common to a single bus. Each stack has a normal density of chips (i.e., two blocks).

As seen from FIG. 3, this configuration is construction in a fashion which is similar to FIG. 2 with the exception of the column address strobe (CAS) input terminals of the 256K DRAM chips being connected in common. To accommodate the common CAS connection and differences in connector pin assignments, each of the selector circuits 10-6B and 10-6D have their enable input terminals E connected to receive double density signal MDDBEX-00. When signal MDDBEX-00 is a binary ONE indicating a single density configuration, the circuits 10-6B and 10-6D are switched to a tristate condition effectively disconnecting them from the numbers.

Figure 4:
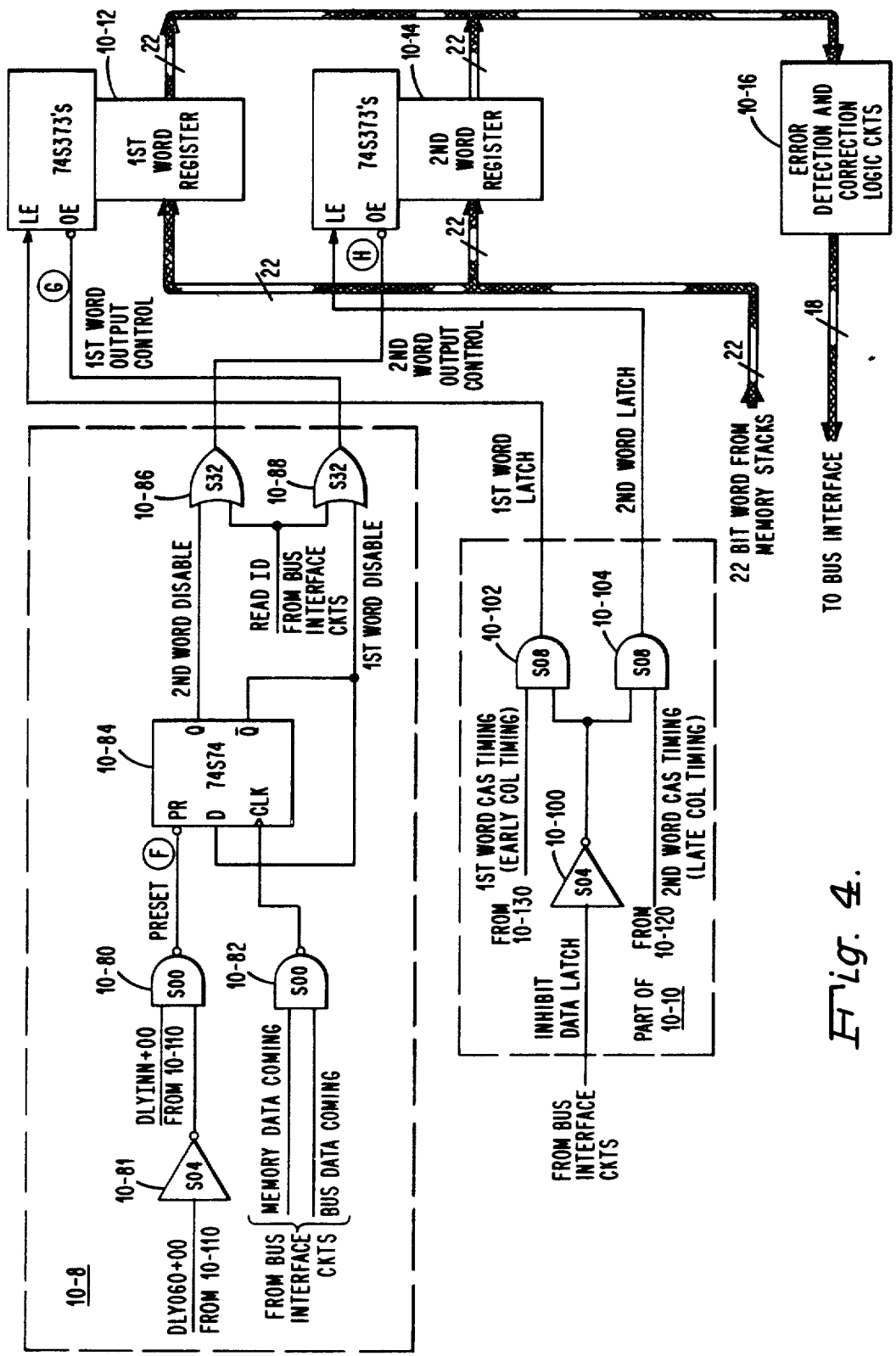
FIGS. 4 and 5 show in greater detail, portions of the subsystem of FIG. 1.

FIG. 4 shows in greater detail, the first and second word registers 10-12 and 10-14 and associated control and timing circuits. Both registers are constructed from D-type transparent latch circuits, such as those designated as SN74S373, manufactured by Texas Instruments Incorporated. As shown, the registers 10-12 and 10-14 have their data input terminals connected in common to receive the 22-bit word from memory stack 10-2. Their output terminals connect in common to bus interface circuits via error detection and correction logic circuits, conventional in design as, for example, such as those in U.S. Pat. No. 4,072,853.

Additionally, each of the registers 10-12 and 10-14 has a latch enabling terminal (LE) and output enabling terminal (OE). When terminal LE is forced to a binary ONE, this enables the signals at the data input terminals to be latched into the register. When terminal OE is forced to a binary ZERO, this allows the latched signals to be applied to the output terminals of the register. This operation is independent of the latching action of the register flip-flops.

As shown, the signals applied to the LE and OE input terminals of registers 10-12 and 10-14 are provided by the associated control and timing circuits of blocks 10-8 and 10-10, respectively. The portion of the timing circuits shown generate the first and second word latch signals which load registers 10-12 and 10-14 in a predetermined desired sequence. In greater detail, the timing circuits include an input inverter 10-100 and a pair of AND gates 10-102 and 10-104 connected as shown.

During a read memory cycle, when an inhibit data latch signal is a binary ZERO, the partially conditioned AND gates 10-102 and 10-104 apply first and second word CAS timing signals, respectively, to the LE terminals of the registers 10-12 and 10-14. This permits first and second data words to be latched into registers 10-12 and 10-14, respectively. In those instances when the INHIBIT DATA LATCH signal is a binary ONE, both AND gates 10-102 and 10-104 are disabled preventing any latching action from taking place.

The control circuits are the output word sequencer 10-8 which includes a pair of input NAND gates 10-80 and 10-82, an inverter 10-81, a D-type flip-flop 10-84 and a pair of output OR gates 10-86 and 10-88 connected as shown. The NAND gate 10-80 in response to timing signals DLYINN+00 and DLY060+00 generates a negative going 60 nanosecond pulse. This pulse is applied to a present input terminal of flip-flop 10-84 which results in it being switched to a binary ONE state. When preset, flip-flop 10-84 forces SECOND WORD DISABLE signal to a binary ONE and a first word DISABLE signal to a binary ZERO. The binary ZERO signal is applied via OR gate 10-88 to the output enable (OE) terminal of register 10-12. This enables the first word to be transferred to the bus interface via error detection and correction logic circuits of block 10-16. At the end of sending out the first word, NAND gate 10-82, in response to signals MEMORY DATA COMING and BUS DATA COMIG being forced to binary ZEROS, produces a positive going signal at a clock input terminal CK which resets flip-flop 10-84 to a binary ZERO. This forces the SECOND DOUBLE WORD DISABLE signal to a binary ZERO. The binary ZERO signal is applied via OR gate 10-86 to the output enable (OE) terminal of register 10-14. Thereafter, in the case of a double word fetch, this enables a second word to be transferred to the bus interface.

Additionally, the word sequencer 10-8 allows address ID information to be received from the bus inerface during a read operation. At that time, signal READ I.D. is forced to a binary ONE which causes sequencer 10-8 to force both the first and second output control signals to binary ONES preventing any signals from being applied to the interface by registers 10-12 and 10-14.

Both the control and timing circuits are constructed from conventional integrated circuits, such as those designated in FIG. 4 (e.g. 74S00, 74S74, 74S08, 74S32, etc.), manufactured by Texas Instruments Inc.

Figure 5:
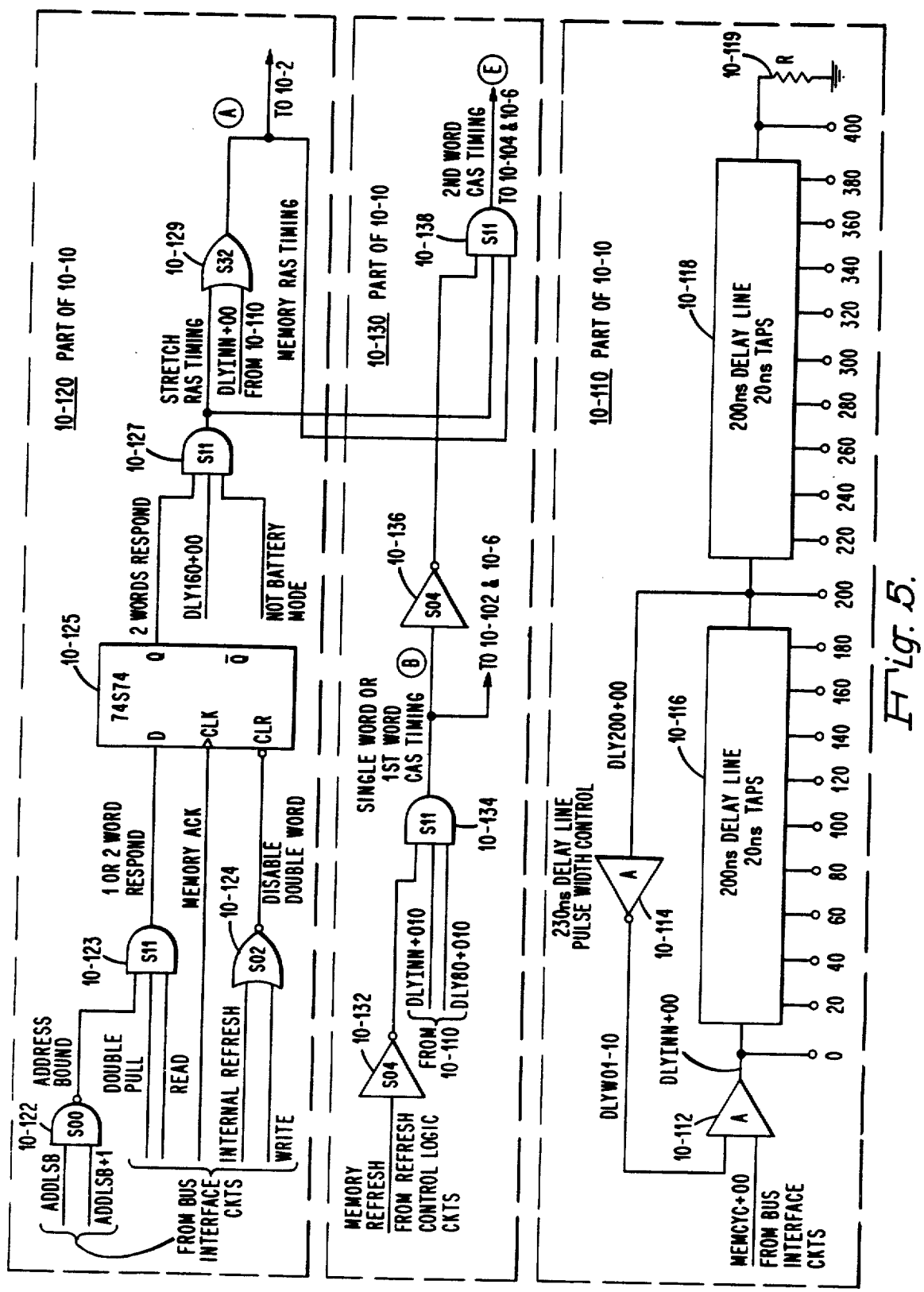

FIG. 5 shows in greater detail, the remaining circuits of block 10-10. As seen from the Figure, these circuits include delay line generator circuits 10-110, row address strobe (RAS) timing circuits 10-120 and column address strobe (CAS) timing circuits 10-130. The circuits 10-110 include an AND gate amplifier circuit 10-112, an inverter circuit 10-114 and a pair of connected 200 nanosecond delay lines 10-116 and 10-118 which are resistively terminated at one end by a resistor 10-119. The generator circuits 10-110 generate a sequence of timing pulses DLYINN+00 through DLY400+00 in response to a memory cycle signal MEMCYC+00 which are applied to a series of output taps labeled 0 through 400, respectively.

When signal DLY200+00 is generated at an output tap, it is also applied to inverter 10-144. The inverted signal DLYW01-10 is fed back by inverter 10-114 to amplifier 10-112 forcing signal DLYINN+00 to a binary ZERO. In this manner, inverter 10-114 establishes a 230 nanosecond width for signal DLYINN+00.

Timing signal DLYINN+00 along with signal DLY160+00 are applied to the RAS timing circuits 10-120. These circuits include gates 10-122 through 10-124, 10-127 and 10-129, in addition to a D-type flip-flop 10-125 which are connected as shown. The NAND gate 10-122 forces its output signal ADDRESS BOUND to a binary ZERO when both low order address signals ADDLSB and ADDLSB+1 are binary ONES. This inhibits AND gate 10-123 from switching flip-flop 10-125 to a binary ONE when clocked by a MEMORY ACKNOWLEDGE signal. In the absence of an address boundary condition AND gate 10-123 switches flip-flop 10-125 to a binary ONE in response to a double fetch/pull memory read request (i.e., when both signals DOUBLEPULL and READ are ONES) when the MEMORY ACKNOWLEDGE signal goes positive. The NOR gate 10-124 forces or clears flip-flop 10-125 to a binary ZERO state during an internal refresh or write cycle of operation (i.e. when signal INTERNAL REFRESH or WRITE is a binary ONE).

The binary ONE output signal TWO WORDS RESPOND output condition AND gate 10-127 to force output signal STRETCH RAS TIMING to a binary ONE in response to timing signal DLY160+00 when the subsystem is not operating under battery power (i.e., when signal NOT BATTERY MODE is a binary ONE). The STRETCHY RAS TIMING signal conditions OR gate 10-129 to extend the length of time that its output signal is a binary ONE.

The MEMORY RAS TIMING signal in addition to being applied to the 256K DRAM chips of stack 10-2 is also applied to the CAS timing circuits 10-130. These circuits also receive the STRETCH RAS TIMING signal from the circuits 10-120, timing signals DLYINN+00 and DLY80+00 from circuits 10-110 and MEMORY REFRESH signal from the refresh control circuits. The circuits 10-130 include series connected inverters 10-132 and 10-136 and AND gates 10-134 and 10-138. In the absence of a memory refresh cycle (i.e., when signal MEMORY REFRESH is a ZERO), AND gate 10-134 forces FIRST WORD CAS TIMING signal to a binary ONE in response to timing signals DLYINN+00 and DLY80+00. In addition to being applied to circuits 10-102 and 10-6, the first word CAS timing signal is inverted by inverter 10-136 and applied as inhibiting input to AND gate 10-138.

At the termination of the FIRST WORD CAS TIMING signal, AND gate 10-138 forces the SECOND WORD CAS TIMING signal to a binary ONE in response to signals STRETCH RAS TIMING and MEMORY RAS TIMING. The SECOND WORD CAS TIMING signal is applied to circuits 10-104 and 10-6. Both the RAS and CAS timing circuits 10-120 and 10-130 are constructed from conventional integrated circuits such as those designated in FIG. 3 (e.g. 74S00, 74S11, 74S74, etc.) manufactured by Texas Instruments Inc.

DESCRIPTION OF OPERATION

With reference to the timing diagram of FIG. 6 and the diagram of FIGS. 7a and 7b, the operation of the preferred embodiment of the present invention disclosed in FIGS. 1 through 5 will now be described. It will be understood that the configurations of memory subsystem 10 shown in FIGS. 2 and 3 can process a variety of memory requests including both single word and double word fetch requests. When a single or double word fetch request is received, this causes the bus interface circuits to generate a number of signals in the desired sequence required for processing that type of request. These signals include the control signals READ I.D., MEMCYC+00, DOUBLE PULL (double fetch only), READ and MEMORY ACKNOWLEDGE, MEMORY DATA COMING and BUS DATA COMING.

In addition to the interface signals mentioned, the subsystem also receives address signals ADDLSB, ADDLSB+1, LSAD01 and LSAD02 from the bus interface which corresponds to the two least significant and most significant address bits of the memory address portion of the request. For the purposes of the present invention, the interface circuits can be considered conventional in design and for example are similar to those circuits disclosed in U.S. Pat. No. 4,185,323. A refresh command signal REFCOM-00 and an initialization signal INITM-00 are also applied but for the purpose of the present invention can be considered binary ONES so as to have no effect.

The double density signal MDDBEX+00 is applied from the stack connector and defines which one of two configurations the memory subsystem 10 is so organized. It is first assumed that subsystem 10 is organized in a common stack configuration as shown in FIG. 2 in which case signal MDDBEX+00 is a binary ONE.

Figure 6:
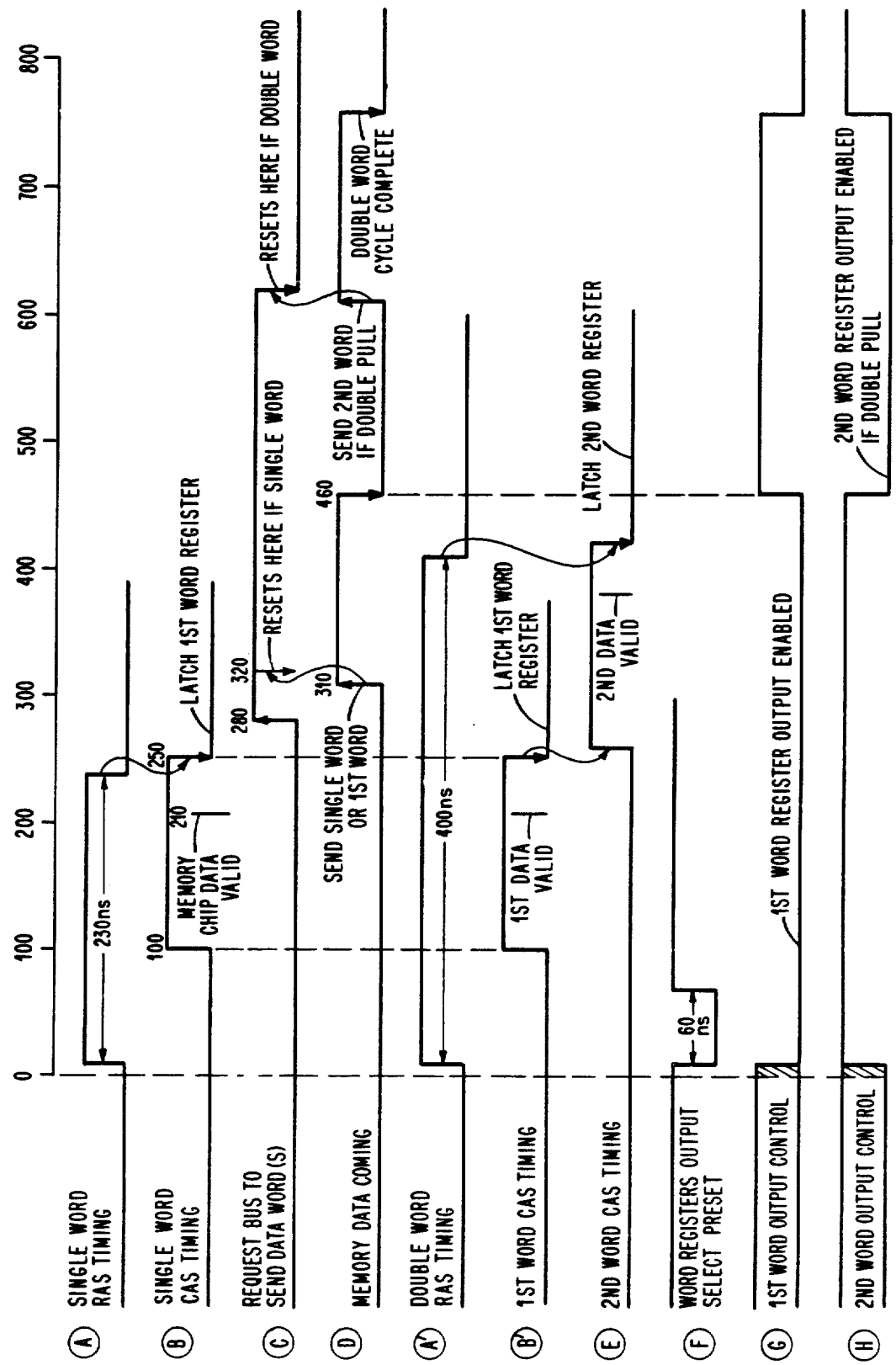
FIG. 6 is a timing diagram used in describing the operation of the present invention.
Figure 7A:
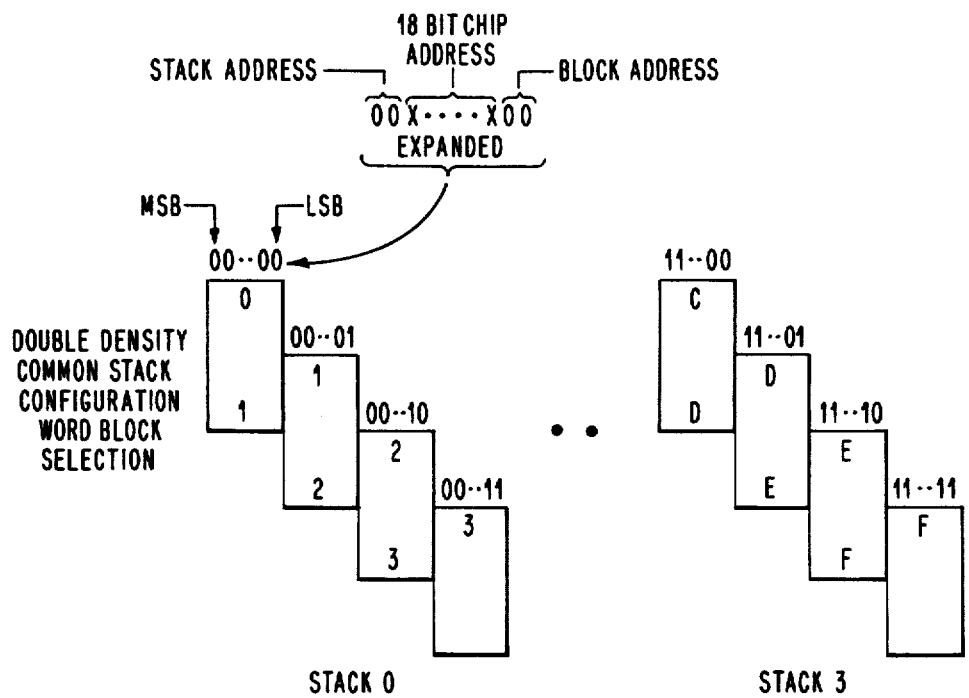
FIGS. 7a and 7b, respectively, are used in describing the operation of the subsystem configurations of FIGS. 2 and 3.

FIG. 6 illustrates diagrammatically the relationships between the different timing signals generated by the circuits of the present invention for processing double fetch memory read requests. When double density signal MDDBEX+00 is a binary ONE and the memory address signals ADDLSB and ADDLSB+1 have the value "00", LA circuit 10-4A operates to select word blocks 0 and 1 by forcing signals DRAS0 and DRAS1 to binary ZEROS. These are the two blocks of memory which are to receive early and late column (CAS) timing signals. The state of least significant address bit ADDLSB determines the order in which the timing signals are applied to the preselected word blocks.

As seen from FIG. 6, in response to the memory request, the timing circuits 10-120 of FIG. 3 generate memory RAS timing signal which corresponds to waveform A or A'. That is, upon receipt of the request, a memory cycle is initiated by forcing memory cycle signal MEMCYC+00 to a binary ONE. This causes the delay line timing circuits 10-110 to generate a sequence of timing signals including DLYINN+00, DLY060+00, DLY80+00 and DLY160+00.

As seen from FIG. 5, since address signals ADDLSB and ADDLSB+1 are not both binary ONES, there is no address boundary condition. Hence, two words will be transferred to the bus interface. That is, the request causes flip-flop 10-125 to be set to a binary ONE which results in the generation of the stretched RAS timing signal of waveform A'.

As seen from FIG. 5, the MEMORY RA TIMING signal is forced to a binary ONE by RAS timing OR gate 10-129 in response to timing signal DLYINN+00. Eighty nanoseconds after the start of signal DLYINN+00, the CAS timing AND gate 10-134 is conditioned by timing signal DLY80+00 to generate the FIRST WORD CAS TIMING signal which corresponds to waveform B' of FIG. 6. As seen from FIG. 2, the EARLY COLUMN CAS TIMING signal is applied selector circuit 10-6A and to AND gate 10-102 of FIG. 4. The selector circuit 10-6A is conditioned by signal ADDLSB to apply the CAS timing signal to the 256K DRAM chips of both blocks 0 and 2. However, since only the chips of block 0 were previously selected, the contents of a first word location specified by the block (row) and column memory addresses which were loaded into the chips in response to the RAS and CAS timing signals (i.e., waveform A' and B') are selected. As seen from waveform B' of FIG. 6, the data word contents accessed from the specified location are valid at 210 nanoseconds from the start of the memory cycle.

It will be noted that signals DLYINN+00 and DLY060+00 applied to the output word sequencer 10-8 at the start of the memory cycle, preset flip-flop 10-84 to a binary ONE as illustrated by waveform F of FIG. 6. This causes OR gate 10-88 to force the FIRST WORD OUTPUT CONTROL signal applied to the OE terminal of register 10-12 to a binary ZERO as shown by waveform G. At the same time, OR gate 10-86 is conditioned to force the SECOND WORD OUTPUT CONTROL signal applied to register 10-14 to a binary ONE as shown by waveform H.

When the circuits 10-110 switch timing signal DLYINN+00 to a binary ZERO, this in turn causes CAS timing AND gate 10-134 to switch the FIRST WORD CAS TIMING signal to a binary ZERO. As seen from waveform B', this conditions the first word register 10-12 to latch the data contents of the selected word location. Since the register 10-12 has already been enabled, the first word contents appear at the register output terminals.

Soon after the start of the memory cycle (i.e., at approximately 280 nanoseconds into the cycle), the bus interface circuits make a bus request to send the first word to the unit which initiated the memory request. This results in the generation of waveform C of FIG. 6. Upon receipt of an acknowledgement from the initiating unit, the bus interface circuits operate to generate waveform D of FIG. 6 which defines the interval during which the first data word is applied to the bus interface.

The termination of the FIRST WORD CAS TIMING signal permits CAS timing AND gate 10-138 to generate a SECOND WORD CAS TIMING signal in response to the STRETCH RAS TIMING signal as shown by waveform E. Additionally, the STRETCH RAS TIMING signal also operates to extend the interval of the MEMORY RAS TIMING signal from 230 nanoseconds to 400 nanoseconds as shown by waveform A' (i.e., sums timing signals DLY160+00 and DLYINN+00). The SECOND WORD CAS TIMING signal is applied to AND gate 10-104 and to selector circuit 10-6B.

The selector circuit 10-6B in turn applies the late column timing signal to the 256K DRAM chips of blocks 1 and 3. However, since only block 1 was previously selected, the contents of the location in that block specified by the block/row and column addresses are read out from the stack. This second word is latched into register 10-14 at the end of the SECOND WORD CAS TIMING signal as shown by waveform E.

When the subsystem completes sending the first word to the interface, signals MEMORY DATA COMING and BUS DATA COMING are forced to binary ONES. As seen from FIG. 5, this causes NAND gate 10-82 to switch sequencer flip-flop 10-84 to a binary ZERO. As seen from waveforms G and H of FIG. 6, this switches the FIRST WORD and SECOND WORD OUTPUT CONTROL signals to a binary ONE and a binary ZERO, respectively. Thereafter, the second word latched in register 10-14 is transferred to the requesting unit in the same manner as described above.

It can be seen that when the least significant address bit signals ADDLSB and ADDLSB+1 are binary ONES, this causes RAS timing NAND gate 10-122 of FIG. 5 to force signal ADDRESS BOUND to a binary ZERO. This inhibits the setting of flip-flop 10-125 to a binary ONE which prevents the generation of the STRETCH RAS TIMING signal. Similarly, a memory read request for a single word (i.e., DOUBLE PULL is a ZERO) prevents the generation of a second CAS timing signal by inhibiting the setting of flip-flop 10-125 to a binary ONE.

In both instances, the MEMORY RAS TIMING signal is prevented from being stretched and the generation of a second CAS timing signal is not permitted to take place. Accordingly, only the first word read out from stack 10-2A is transferred to the requesting unit. The unit is also informed that a second word is not being transferred because of the address boundary condition. As seen from the first series of blocks of stack 0 of FIG. 7a, block selection proceeds as shown as a function of the least significant address bit signals. The blocks of remaining stacks 1 through 3 are in turn sequenced through in the same fashion as stack 0 in response to changes in both the least significant and most significant bit address signals.

FIG. 6 also illustrates the timing for the adjacent stack configuration of memory subsystem 10 shown in FIG. 3. In this instance, memory double density signal MDDBEX+00 is a binary ZERO. When double density signal MDDBEX+00 is a binary ZERO, and memory address signals ADDLSB and ADDLSB+1 are binary ZEROS, PLA circuit 10-4A operates to select blocks 0 and 4 from adjacent stack 0 and stack 1. The binary ONE state of signal MDDBEX-00 disables selector circuits 10-6B and 10-6D. Thus, the early and late column timing signals are applied to the CAS input terminals of blocks 0 and 4 via selector circuits 10-6A and 10-6C. The words from the adjacent stacks are loaded into registers 10-12 and 10-14 in the same manner as described above.

Figure 7B:
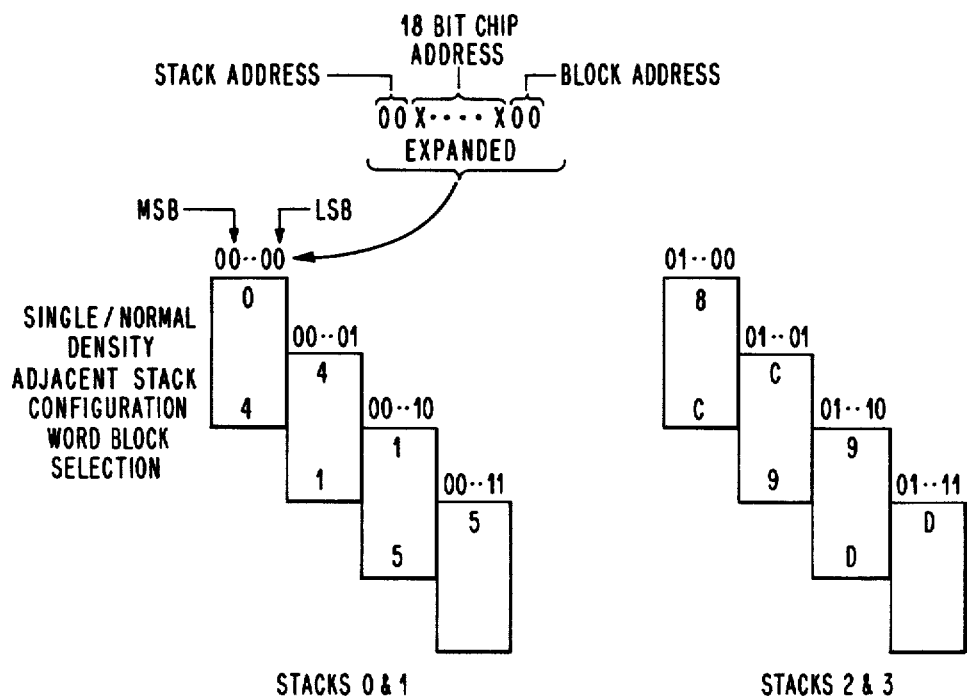

As seen from FIG. 7b, block selection proceeds through adjacent stacks 0 and 1 as shown. The next pair of stacks 2 and 3 are selected when most significant address bit LSAD02 switches to a binary ONE. At that point, block selection proceeds through adjacent stacks 2 and 3 as shown in FIG. 7b. Thus, signal LSAD02 serves as a stack selection signal.

It is seen that the state of the double density signal defines whether or not the pair of words come from a common stack or are distributed between two adjacent stacks. The signal in turn conditions the PLA circuit 10-4A to cause block selection to take place within a single stack or between two adjacent stacks as a function of the configuration.

It has been found that in the case of the present embodiment it is more efficient to handle 75 percent of double word fetches rather than introducing delay into each memory cycle to satisfy a larger percentage of double word fetches. Moreover, it will be appreciated as the number of word blocks increases, there is a corresponding increase in efficiency.

From the above, it is seen how the apparatus of the present invention, without any loss of performance, is able to provide a double word fetch capability for both new and old memory designs. In fact, in certain cases, system performance will increase as a result shortening the overall memory cycle except for double word fetches. This simplicity in interface construction and operation permits the utilization of smaller increments of memory at lower cost and facilitates expansion.

Many changes may be made to the preferred embodiment without departing from the teachings of the present invention. For example, the number of word blocks may be increased, the types of circuits changed, etc.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A memory subsystem used in a system in which said subsystem couples to a single word bus for receiving memory requests and for transferring information words to said bus during bus cycles of operation, said memory requests including a multibit address and certain ones of said requests being coded to specify a predetermined type of memory read operation requiring a transfer of a plurality of words over successive bus cycles of operation, said memory subsystem comprising:

a number of addressable single word wide memory stacks, each including a plurality of word blocks of dynamic random access memory chips mounted on a single circuit board;

decode means coupled to said plurality of blocks of chips of said number of stacks and to said bus to receive a number of least significant and most significant bits of each said multibit address and an input density signal, said decode means being operative to generate a plurality of select signals, said select signals preselecting a corresponding plurality of word blocks from a common stack or from at least a pair of adjacent stacks of said number of memory stacks as a function of said input density signal;

selection means coupled to said plurality of blocks of chips of said number of stacks and to receive at least one of said number of least significant bits and said input density signal;

a plurality of registers coupled in common to said number of stacks; and, timing means for generating a sequence of timing signals for each predetermined read type of read operation, said timing means being coupled to said number of memory stacks, to said selection means and to said plurality of registers, said sequence of timing signals including a first timing signal having a duration for defining a first interval and a plurality of sequential timing signals which occur during said first interval, said blocks of chips preselected by said select signals being conditioned by said first timing signal for access, said plurality of timing signals being applied selectively by said selection means to different groups of blocks of chips within said common stack or at least said pair of adjacent stacks for read out of a plurality of words in tandem into said registers from said blocks preselected by said select signals within said common stack or distributed between at least said pair of adjacent stacks.

2. The subsystem of claim 1 wherein said decode means includes a number of programmable logic array (PLA) circuits, corresponding in number to one-half of said number of addressable memory stacks, each of said number of PLA circuits being programmed to generate a number of sets of select signals, each set being applied to a different predetermined one of said number of addressable memory stacks.

3. The subsystem of claim 2 wherein said number of said stacks has a value equal to two and said number of PLA circuits has a value equal to one, said one PLA circuit having first and second sets of output pins connected to first and second ones of said stacks and said PLA circuit being programmed to produce outputs on said pins according to the following Boolean equations:

| FIRST SET: |
|---|
| Output 1 = /1+/2+/3\*/4\*/5\*/6; |
| Output 2 = /1+/2+/3\*/4\*/5\*/6\*7;<br>+3\*/4\*/5\*/6;<br>+/3\*4\*/5\*/6\*/7; |
| Output 3 = /1+/2+3\*/4\*/5\*/6\*7;<br>+/3\*4\*/5\*/6\*7; and, |
| Output 4 = /1+/2+4\*/5\*/6\*7; |
| SECOND SET: |
| Output 1 = /1+/2+/4\*/5\*/6\*/7;<br>+/3\*/4\*5\*/6\*/7; |
| Output 2 = /1+/2+4\*/5\*/6\*/7<br>+/4\*5\*/6\*7; |
| Output 3 = /1+/2+3\*/4\*5\*/6\*7<br>+/3\*4\*5\*/6\*7; and, |
| Output 4 = /1+/2+4\*5\*/6\*7; | wherein the symbols +, \* and / have the following meanings:

+ = OR function;

\* = AND function; and,

/ = the designated signal is low or a binary ZERO.

4. The subsystem of claim 2 wherein said number of said stacks has a value equal to four and said number of PLA circuits has a value equal to two, a first PLA circuit having first and second sets of output pins connected respectively to first and second ones of said stacks and a second PLA circuit having first and second sets of output pins connected respectively to third and fourth ones of said stacks, said first and second PLA circuits being programmed to produce outputs on said pins according to the following Boolean equations:

| FIRST PLA CIRCUIT: |
|---|
| FIRST SET: |
| Output 1 = /1+/2+/3\*/4\*/5\*/6; |
| Output 2 = /1+/2+/3\*/4\*/5\*/6\*7;<br>+3\*/4\*/5\*/6;<br>+/3\*4\*/5\*/6\*/7; |

-continued

```
Output 3 =  /1+/2+3*/4*/5*/6*7;
            +/3*4*/5*/6*7; and,
Output 4 =  /1+/2+4*/5*/6*7;
            SECOND SET:
Output 1 =  /1+/2+/4*/5*/6*/7;
            +/3*/4*5*/6*/7;
Output 2 =  /1+/2+4*/5*/6*/7
            +/4*5*/6*7;
Output 3 =  /1+/2+3*/4*5*/6*7
            +/3*4*5*/6*7; and,
Output 4 =  /1+/2+4*5*/6*7;
            SECOND PLA CIRCUIT:
            FIRST SET:
Output 1 =  /1+/2+/3*/4*5*/6*/7+/3*/4*/5*6*7;
Output 2 =  /1+/2+3*/4*5*/6*/7+/3*4*5*/6*/7;
            +/4*/5*6*7;
Output 3 =  /1+/2+3*/4*/5*6*7+/3*4*/5*6*7;
Output 4    /1+/2+4*/5*6*7;
            SECOND SET:
Output 1 =  /1+/2+/4*5*/6*/7+/3*/4*5*6*7;
Output 2 =  /1+/2+4*5*/6*/7+/4*5*6*7;
Output 3 =  /1+/2+3*/4*5*6*7+/3*4*5*6*7; and,
Output 4 =  /1+/2+4*5*6*7;
``` wherein the symbols +, * and / have the following meanings:

+ = OR function,
* = AND function; and,
/ = the designated signal is low or a binary ZERO.

5. The memory subsystem of claim 1 wherein said input density signal when in a first state conditions said decode means and said selection means to cause in turn each one of said number of stacks to read out said plurality of words in tandem from each one of said number of stacks.

6. The memory subsystem of claim 1 wherein said input density signal when in a second state conditions said decode means and said selection means to condition in turn a different pair of adjacent stacks to read out said plurality of words in tandem from said different pair of said adjacent stacks.

7. The memory subsystem of claim 1 wherein said selection means includes a plurality of groups of selector circuits, each selector circuit of each group being coupled to a number of said plurality of blocks of chips of a different one of said stacks, to said timing means and to receive said one of said number of least significant bits and said input density signal when in a first state indicating a common stack configuration conditioning first and second ones of each group of selector circuits in succession to apply said timing signals to said number of said plurality of blocks of chips of said different one of said stacks for read out of said plurality of words from said different one of said stacks.

8. The memory subsystem of claim 7 wherein each of said number of stacks of said common stack configuration has at least twice as many word blocks than said number of stacks organized in an adjacent stack configuration.

9. The memory subsystem of claim 7 wherein each of said selector circuits of each group are connected in common to said plurality of blocks of chips, said input density signal when in a second state indicating an adjacent stack configuration conditioning only a predetermined one of said selector circuits of each group in succession to apply said timing signals to said plurality of blocks of chips for read out of said plurality of words from adjacent stacks.

10. A memory subsystem used in a system which couples to a single word bus and receives memory requests, each request including a multibit address having first and second address portions, said subsystem comprising:

a number of addressable single word wide modules connected in common to an internal bus, each including a plurality of word blocks of dynamic random access memory chips;

control means coupled to said modules and to said single word bus for receiving a plurality of bits of each address and an input control signal, said address bits coded to preselect a group of blocks within said plurality of blocks of one of said modules or from adjacent ones of said modules as a function of said input control signal;

selector means coupled to said number of addressable single word wide modules and to said single word bus for receiving at least a least significant bit of each address and said input control signal;

a plurality of registers coupled in common to said internal bus; and, timing means for generating a sequence of timing signals in response to each predetermined type of request, said timing means being coupled to said modules, to said selector means and to said plurality of registers, a first one of said timing signals conditioning said chips of said group of blocks preselected by said address bits of said one of said modules or said adjacent ones of said modules to store said first address portion of said multibit address and second and third ones of said timing signals conditioning said selector means to cause each of said plurality of blocks of said modules to store said second address portion of said multibit address for read out of words in tandem from only said multibit address for read out of words in tandem from only said group of blocks preselected by said address bits within said one of said modules or said adjacent modules in a predetermined sequence of said plurality of registers.

11. The subsystem of claim 10 wherein said control means includes a number of programmable logic array (PLA) circuits having a number of sets of outputs, each of said number of PLA circuits being programmed to generate said number of sets of select signals on said outputs, each set of outputs being applied to a different predetermined one of said number of addressable memory modules.

12. The subsystem of claim 10 wherein said control means includes a number of programmable logic array (PLA) circuits, corresponding in number to at least one-half of said number of addressable memory modules, each of said number of PLA circuits being programmed to generate said number of sets of select signals, each set being applied to a different predetermined one of said number of addressable memory modules.

13. The subsystem of claim 12 wherein said number of said modules has a value equal to two and said number of PLA circuits has a value equal to one, said one PLA circuit having first and second sets of output pins connected to first and second ones of said modules and said PLA circuit being programmed to produce outputs on said pins according to the following Boolean equations:

```
            FIRST SET:
Output 1 =  /1+/2+/3*/4*/5*/6;
Output 2 =  /1+/2+/3*/4*/5*/6*7;
```

```
                        -continued
                         +3*/4*/5*/6;
                         +/3*4*/5*/6*/7;
            Output 3 =  /1+/2+3*/4*/5*/6*7;
                         +/3*4*/5*/6*7; and,
            Output 4 =  /1+/2+4*/5*/6*7;
                         SECOND SET:
            Output 1 =  /1+/2+/4*/5*/6*/7;
                         +/3*/4*5*/6*/7;
            Output 2 =  /1+/2+4*/5*/6*/7
                         +/4*5*/6*7;
            Output 3 =  /1+/2+3*/4*5*/6*7
                         +/3*4*5*/6*7; and,
            Output 4 =  /1+/2+4*5*/6*7;
``` wherein the symbols +, * and / have the following meanings:
+ =OR function,
* =AND function; and,
/ =the designated signal is low or a binary ZERO.

14. The subsystem of claim 12 wherein said number of said modules has a value equalt to four and said number of PLA circuits has a value equal to two, a first PLA circuit having first and second sets of output pins connected respectively to first and second ones of said modules and a second PLA circuit having first and second sets of output pins connected respectively to third and fourth ones of said modules, said first and second PLA circuits being programmed to produce outputs on said pins according to the following Boolean equations:

```
                    FIRST PLA CIRCUIT:
                         FIRST SET:
            Output 1 =  /1+/2+/3*/4*/5*/6;
            Output 2 =  /1+/2+/3*/4*/5*/6*7;
                         +3*/4*/5*/6;
                         +/3*4*/5*/6*/7;
            Output 3 =  /1+/2+3*/4*/5*/6*7;
                         +/3*4*/5*/6*7; and,
            Output 4 =  /1+/2+4*/5*/6*7;
                         SECOND SET:
            Output 1 =  /1+/2+/4*/5*/6*/7;
                         +/3*/4*5*/6*/7;
            Output 2 =  /1+/2+4*/5*/6*/7
                         +/4*5*/6*7;
            Output 3 =  /1+/2+3*/4*5*/6*7
                         +/3*4*5*/6*7; and,
            Output 4 =  /1+/2+4*5*/6*7;
                    SECOND PLA CIRCUIT:
                         FIRST SET:
            Output 1 =  /1+/2+/3*/4*5*/6*/7+/3*/4*/5*6*7;
            Output 2 =  /1+/2+3*/4*5*/6*/7+/3*4*5*/6*/7;
                         +/4*/5*6*7;
            Output 3 =  /1+/2+3*/4*/5*6*7+/3*4*/5*6*7;
            Output 4   /1+/2+4*/5*6*7;
                         SECOND SET:
            Output 1 =  /1+/2+/4*5*/6*/7+/3*/4*5*6*7;
            Output 2 =  /1+/2+4*5*/6*/7+/4*5*6*7;
            Output 3 =  /1+/2+3*/4*5*6*7+/3*4*5*6*7; and,
            Output 4 =  /1+/2+4*5*6*7;
``` wherein the symbols +, * and / have the following meanings:
+ =OR function;
* =AND function; and,
/ =the designated signal is low or a binary ZERO.

15. The memory subsystem of claim 10 wherein said input control signal when in a first state conditions said control means and said selector means to condition in turn said group of blocks of each one of said number of modules to read out said words in tandem from each one of said modules.

16. The memory subsystem of claim 10 wherein said input control signal when in a second state conditions said control means and said selector means to condition in turn said group of blocks of a different pair of adjacent modules to read out said words in tandem from said different pair of said adjacent modules.

17. The memory subsystem of claim 10 wherein said selector means includes a plurality of groups of selector circuits, each selector circuit of each group being coupled to a number of said plurality of blocks of chips of a different one of said number of modules, to said timing means and to receive said least significant bit of said address and said input control signal, said input control signal when in a first state indicating a common module configuration causing first and second ones of each group of selector circuits in succession to apply said timing signals to said number of said plurality of blocks of chips of a different one of said number of modules for read out of a plurality of words from a different one of said number of modules.

18. The memory subsystem of claim 17 wherein each of said number of modules of said common module configuration at least has twice as many word blocks as said number of modules when organized in an adjacent module configuration.

19. The memory subsystem of claim 17 wherein each of said selector circuits of each group are connected in common to said plurality of blocks of chips, said input control signal when in a second state indicating an adjacent module configuration conditioning only a predetermined one of said selector circuits of each group in sucession to apply said timing signals to said number of said plurality of blocks of chips for read out of said plurality of words from adjacent modules.

20. The method of constructing a memory subsystem which couples to a single word bus for receiving memory requests and for transferring words to said bus during successive bus cycles of operation, each request including a multibit address having least significant and bit address portion, said method comprising the steps of:
  (a) mounting all of a number of word blocks of chips on a single common board to provide a single word wide interface in a first configuration of said memory subsystem;
  (b) alternatively mounting all of a number of word blocks of chips on adjacent boards which connect in common to said interface in a second configuration of said memory subsystem;
  (c) generating a density of control signal common to said boards for indicating when said subsystem is in said first or said second configuration
  (d) preselecting a number of blocks within said common board or adjacent boards in response to said least significant bit address portion and said control signal;
  (e) generating a row address pulse and a number of column address pulses within an interval defined by said row address pulse; and,
  (f) applying said number of column address pulses to different sets of word block chips by selector means for sequentially reading out a plurality of words in tandem from said blocks preselected in step (d) within said common board or distributed between said adjacent boards to said single word wide interface.

* * * * *